United States Patent
Zhang et al.

(10) Patent No.: US 8,044,711 B1
(45) Date of Patent: Oct. 25, 2011

(54) CLOCK SIGNAL NOISE SHAPING

(75) Inventors: Michael Yimin Zhang, Palo Alto, CA (US); Tat C. Choi, Saratoga, CA (US)

(73) Assignee: Pericom Semiconductor Corporation, San Jose, CA (US)

( * ) Notice: Subject to any disclaimer, the term of this patent is extended or adjusted under 35 U.S.C. 154(b) by 0 days.

(21) Appl. No.: 12/704,150

(22) Filed: Feb. 11, 2010

(51) Int. Cl.
*H03B 1/00* (2006.01)

(52) U.S. Cl. .................................... 327/552; 327/553

(58) Field of Classification Search ........................ None
See application file for complete search history.

(56) References Cited

U.S. PATENT DOCUMENTS

| | | | | |
|---|---|---|---|---|
| 6,115,430 | A * | 9/2000 | Tanaka et al. | 375/318 |
| 6,175,260 | B1 * | 1/2001 | Cho | 327/280 |
| 7,076,233 | B2 * | 7/2006 | Iancu | 455/334 |
| 7,439,889 | B2 * | 10/2008 | Fujimoto | 341/143 |
| 2009/0243510 | A1 * | 10/2009 | Pauritsch et al. | 315/294 |

* cited by examiner

*Primary Examiner* — An Luu
(74) *Attorney, Agent, or Firm* — The Webostad Firm

(57) ABSTRACT

A method and apparatus for clock signal noise shaping are described. Embodiments of a clock circuit include a filter coupled to receive an input clock signal and to provide an output clock signal. The filter filters noise of the input clock signal to shape the noise to provide the output clock signal. In a method for adjustment of phase noise, input clock signaling having the phase noise is obtained, and the input clock signal is filtered to adjust the phase noise to provide output clock signaling.

15 Claims, 3 Drawing Sheets

CLOCK SIGNAL NOISE SHAPING

FIELD

One or more aspects of the invention generally relate to integrated circuits and, more particularly, to clock signal noise shaping.

BACKGROUND

Conventionally, an input clock signal is provided to a phase lock loop ("PLL") for locking to such input clock signal to provide an output clock signal. However, as data rates have increased, such as a gigabit per second or more for example for serial links, phase noise associated with the input clock signal is more of a problem.

Accordingly, it would be desirable and useful to address phase noise in a clock signal. More particularly, it would be both desirable and useful to address phase noise in a clock signal for serial links having at least a gigabit-per-second bit rate.

BRIEF SUMMARY

One or more aspects generally relate to integrated circuits and, more particularly, to clock signal noise shaping.

Along those lines, an embodiment of a clock circuit is described. The clock circuit includes a filter coupled to receive an input clock signal and to provide an output clock signal. The filter is for filtering noise of the input clock signal to shape the noise to provide the output clock signal.

The clock circuit may include a lock loop circuit coupled to receive the output clock signal from the filter. Such lock loop circuit may be a phase lock loop or may be a delay lock loop.

The clock circuit may include a lock loop circuit directly connected to the filter to receive the output clock signal. Such lock loop circuit may be a phase lock loop or a delay lock loop.

The filter may be a low-pass filter, a band-pass filter, a high-pass filter, or an equalization filter. The filter may be a programmable filter. Such programmable filter may have programmable poles and zeroes for noise shaping.

The input clock signal may include a first input clock signal and a second input clock signal. The clock circuit may further include a buffer coupled to the filter to provide the first input clock signal and the second input clock signal as the input clock signal to the filter, the first input clock signal and the second input clock signal being at least approximately 180 degrees out-of-phase with respect to one another. The buffer may be coupled to receive a first serial reference clock signal and a second serial reference clock signal to respectively provide the first clock signal and the second clock signal, the first serial reference clock signal and the second serial reference clock signal being at least approximately 180 degrees out-of-phase with respect to one another. A phase lock loop may be coupled to receive the output clock signal as a single signal and configured to provide a first output clock signal and a second output clock signal, the first output clock signal and the second output clock signal being at least approximately 180 degrees out-of-phase with respect to one another. The first output clock signal and the second output clock signal may each at least meet a phase noise requirement specified for at least a gigabit-per-second serial link; the phase lock loop may include a programmable counter for frequency translation; and the filter, the buffer, and the phase lock loop may all be formed on a same integrated circuit chip.

Also described is a method for adjustment of phase noise, in which input clock signaling having the phase noise is obtained. The input clock signal is filtered to adjust the phase noise to provide output clock signaling.

In such method, the filtering may include programming the filter to shape the phase noise; and shaping the phase noise responsive to the programming to at least meet a specification for the phase noise for at least a gigabit-per-second link. The output clock signaling may be provided to a phase lock loop; a counter of the phase lock loop may be programmed; a first frequency of the input clock signaling may be translated to a second frequency different from the first frequency; and operative clock signaling may be output at the second frequency.

BRIEF DESCRIPTION OF THE DRAWING(S)

Accompanying drawing(s) show exemplary embodiment(s) in accordance with one or more aspects of the invention; however, the accompanying drawing(s) should not be taken to limit the invention to the embodiment(s) shown, but are for explanation and understanding only.

DETAILED DESCRIPTION

In the following description, numerous specific details are set forth to provide a more thorough description of the specific embodiments. It should be apparent, however, to one skilled in the art, that the invention may be practiced without all the specific details given below. In other instances, well-known features have not been described in detail so as not to obscure the embodiments. For ease of illustration, the same number labels are used in different diagrams to refer to the same items; however, in alternative embodiments the items may be different.

In the following description, for purposes of explanation, specific nomenclature is set forth to provide a thorough understanding of the various inventive concepts disclosed herein. However, it will be apparent to one skilled in the art that these specific details are not required in order to practice the various inventive concepts disclosed herein.

Figure 1:
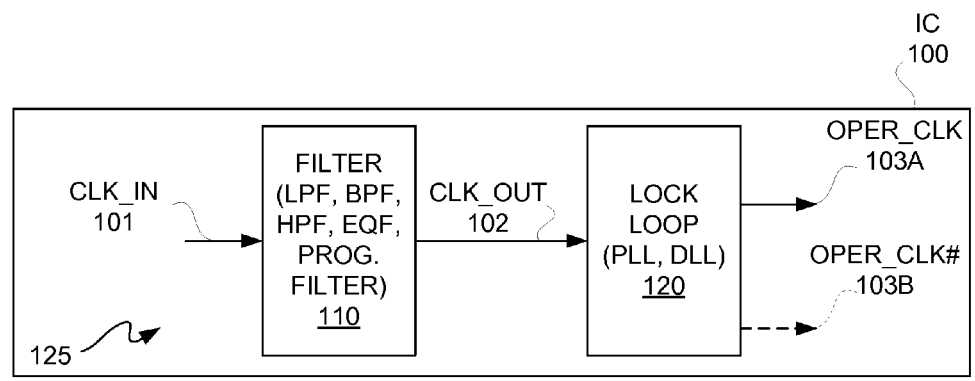
FIGS. 1 and 2 are block diagrams depicting respective exemplary embodiments of clock circuits of respective integrated circuits.

FIG. 1 is a block diagram depicting an exemplary embodiment of an integrated circuit ("IC") 100. IC 100 includes clock circuit 125. Clock circuit 125 includes filter 110 and lock loop 120. Filter 110 is coupled to receive an input clock signal 101. Input clock signal 101 may have noise that affects its edge alignment. Conventionally, this is referred to as phase noise. However, it should be understood that such noise may not only affect phase, but may have an impact on frequency of input clock signal 101. Accordingly, for purposes of clarity, the term "noise" as used herein refers to affecting either frequency or phase, or both, of a clock signal, where such noise may cause such clock signal to be either or both out of a target frequency range or out of a target phase alignment window. The term "noise" is not meant to include signal perturbations conventionally associated with variations in amplitude of a digital clock signal.

Filter 110 may be a low pass filter ("LPF"), a band pass filter ("BPF"), a high pass filter ("HPF"), an equalization filter ("EQF"), or a programmable filter, or a combination of one or more of these types of filters. Filter 110 is configured to shape or suppress, or a combination thereof, noise in input clock signal 101 in order to provide output clock signal 102 to meet a target frequency range or phase window, or combination thereof. Thus, it should be understood that noise shaping or suppression, or combination thereof, performed by filter 110 may be used to adjust a noncompliant timing signal into a compliant timing signal with respect to a protocol or specification associated with at least a one gigabit-per-second bit rate. It should further be understood that output clock signal 102 may be directly connected to an input port of lock loop 120. In other words, filter 110 may be dedicated to shaping or suppressing noise in input clock signal 101, and not used for another task.

If filter 110 is a programmable filter, then one or more poles or one or more zeroes, or a combination thereof, of programmable filter 110 may be set so as to shape the noise in input clock signal 101 to provide a compliant timing signal, namely output clock signal 102.

Output clock signal 102 is provided as an input clock signal to lock loop 120. Lock loop 120 may be a phase lock loop ("PLL") or a delay lock loop ("DLL"). For purposes of clarity by way of example and not limitation, it shall be assumed that lock loop 120 is a PLL.

PLL 120 provides operative clock signal 103A. Optionally, PLL 120 may additionally provide operative clock signal 103B, which may be at least approximately 180 degrees out of phase with respect to operative clock signal 103A. It should be understood that in a conventional PLL, an LPF is used. Thus, filter 110 may be limited to noise shaping of frequencies outside the range of the LPF of PLL 120. PLL 120 may receive a single input clock signal, such as output clock signal 102, and provide one or more operative clock signals in response. However, by shaping noise in input clock signal 101 prior to reception by PLL 120, PLL 120 may operate with greater efficiency and accuracy.

It should be understood that IC 100 may be used for a high-speed serial link. By "high-speed serial link," it is generally meant a serial link having at least a gigabit-per-second bit rate. Furthermore, it should be understood that differential or single-ended serial links may be implemented using IC 100 for meeting any of a variety of specifications, such as those selected from a group consisting of PCIe, SATA, SAS, XAUI, and SPI. Furthermore, it should be understood that clock circuit 125 may be implemented in IC 100, where IC 100 provides an interface for any one or more of the above or other specifications.

In addition to noise shaping with by filter 110, a lock loop, such as PLL 120, may be used to provide frequency translation as well in a clock circuit 125. It should be understood that by having a filter 110 precede a lock loop, noise shaping may be used in order to enhance accuracy of frequency translation, and more particularly, to meet or exceed phase noise thresholds which may be imposed by a gigabit-or-more-per-second serial link specification. Thus, a filter, such as filter 110, may be used for noise shaping, which may include noise suppression, in combination with a lock loop for frequency translation, and thus a timing signal, such as input clock signal 101 which in some instances may not be compliant with a serial link specification, may be translated or reformed such that it is compliant with such specification. Furthermore, by having programmability of either or both filter 110 and lock loop 120 a wide range of noise shaping and frequency translation, respectively, may be provided.

Furthermore, for filter 110 being an equalization filter, output clock signal 102 may be an equalized clock signal. An equalized clock signal 102 has been noise shaped for generally equal distribution.

Figure 2:
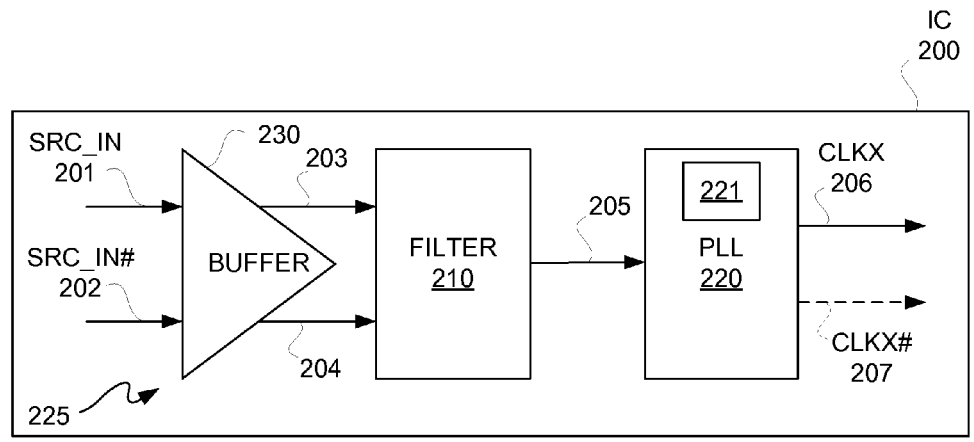

Referring to FIG. 2, there is shown a block diagram depicting an exemplary embodiment of a clock circuit 225 of an IC 200. IC 200 may be the same as IC 100 of FIG. 1. A serial reference clock input 201 is coupled as an input clock signal to an input port of a buffer 230. Another input port of buffer 230 is coupled to receive a serial reference clock 202, where serial reference clock 202 is at least approximately 180 degrees out of phase with respect to serial reference clock 201.

Buffer 230 is coupled to provide serial input clock signal 203 and serial input clock signal 204 to filter 210, where serial input clock signal 203 and serial input clock signal 204 are respectively buffered versions of serial reference clock 201 and serial reference clock 202. Again, it should be understood that serial input clock signals 203 and 204 are at least approximately 180 degrees out of phase with respect to one another. Filter 210 may be filter 110 of FIG. 1.

Filter 210 is configured to shape noise of serial input clock signals 203 and 204 for providing serial output clock signal 205. Filter 210 is programmable, having settable poles and zeroes for noise shaping of noise affecting phase of serial input clock signals 203 and 204. Filter 210 is coupled to provide output clock signal 205 as an input clock signal to PLL 220.

PLL 220 may include a programmable counter 221. Programmable counter 221 may be programmed for frequency translation. PLL 220 may be coupled for providing output clock signal 206 and optionally output clock signal 207, where output clock signal 207 may be at least approximately 180 degrees out of phase with respect to output clock signal 206. Thus, it should be understood that depending on the number of poles and zeroes programmable in filter 210, a relatively wide range of noise shaping may be implemented. Furthermore, depending on the counts programmable in programmable counter 221, a relatively wide range of frequency translations may be obtained.

In an embodiment, programmable filter 210 may be an equalizer with different peak frequency and/or gain level setting. PLL 220 may be a PLL based zero delay buffer.

Figure 3:
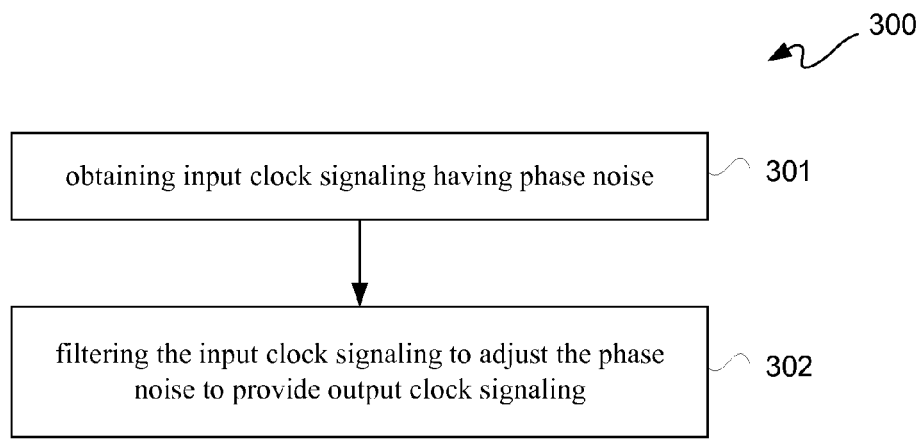
FIG. 3 is a flow diagram depicting an exemplary embodiment of a phase noise shaping flow.

FIG. 3 is a flow diagram depicting an exemplary embodiment of a noise shaping flow 300. At 301, input clock signaling having noise is obtained. At 302, the input clock signal is filtered to adjust the noise to provide output clock signaling with less impact on phase thereof by such noise. This adjustment of noise may include shaping or suppression of noise such that the phase of resultant output clock signaling responsive to input clock signaling is within a specified range, such as may be specified in a serial link specification. Again, examples of serial link specifications include but are not limited to PCIe, SATA, SAS, XAUI, and SPI.

Figure 4:
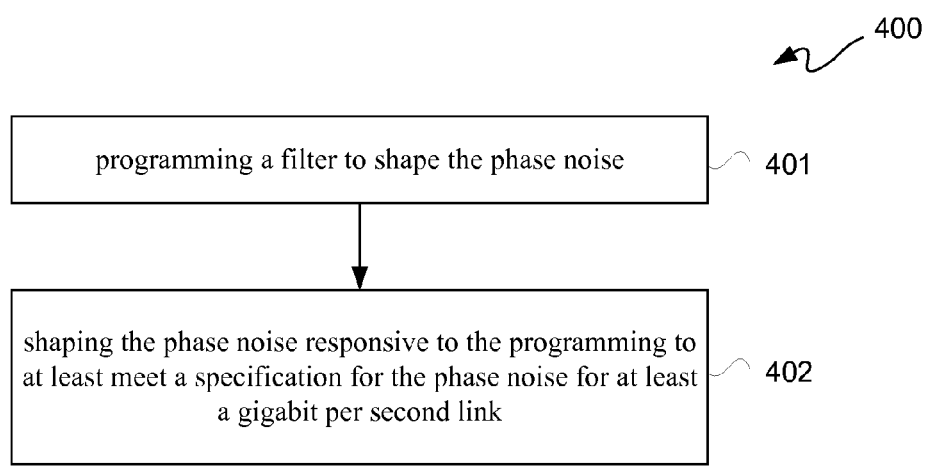
FIG. 4 is a flow diagram depicting an exemplary embodiment of another phase noise shaping flow.

FIG. 4 is a flow diagram depicting an exemplary embodiment of a noise shaping flow 400. With simultaneous reference to FIGS. 3 and 4, flow 400 is further described. At 302, the filtering to adjust noise may include at 401 programming a filter to shape such noise. Furthermore, such filtering at 302 may include at 402 shaping the noise responsive to the programming of such filter. Such shaping may be to at least meet a specification for the phase noise for a serial link, where such serial link is at least a gigabit-per-second link.

Figure 5:
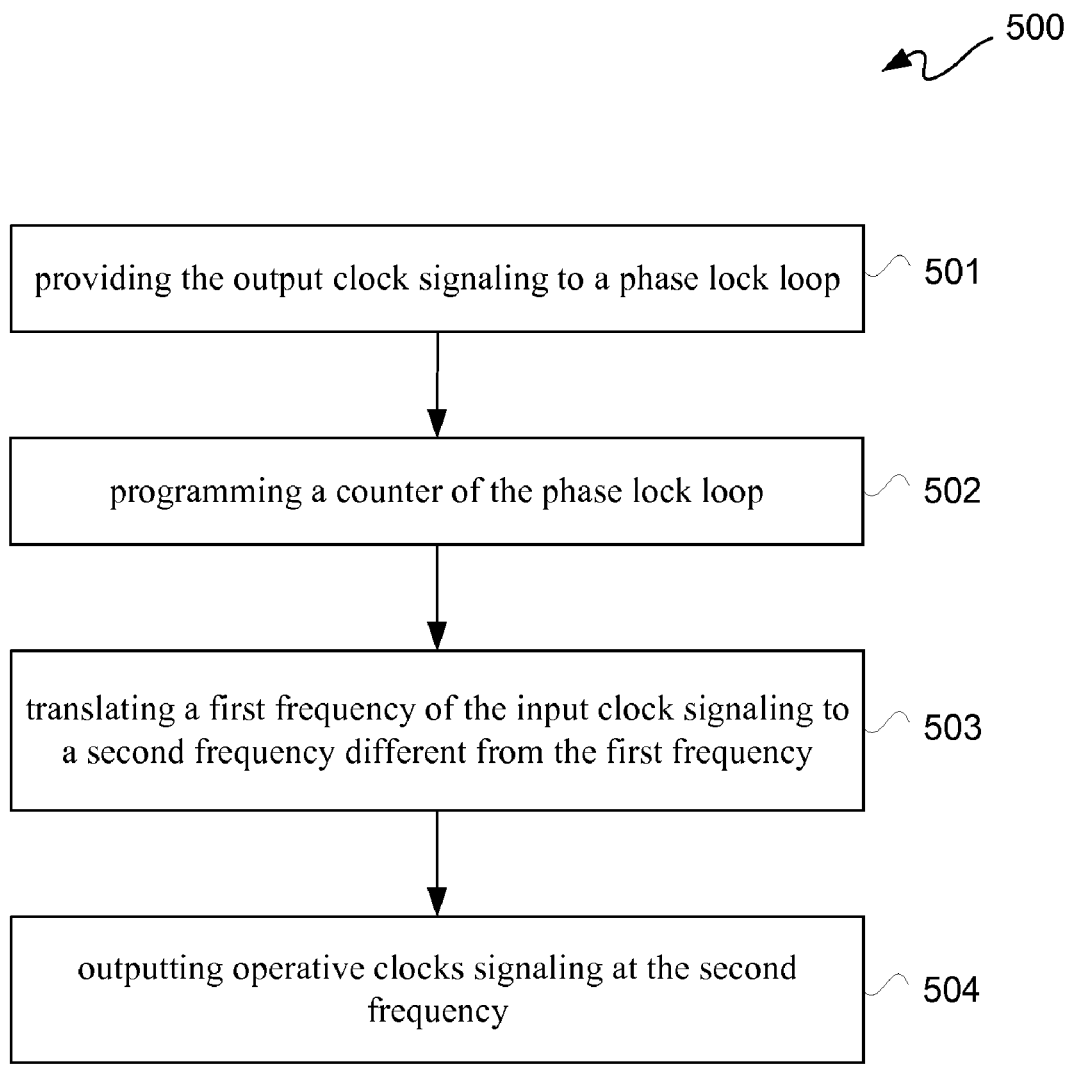
FIG. 5 is a flow diagram depicting an exemplary embodiment of a phase lock loop flow.

Referring to FIG. 5, there is shown a flow diagram depicting an exemplary embodiment of a phase lock loop flow 500. With simultaneous reference to FIGS. 3 and 5, PLL flow 500 is further described.

After filtering input clock signaling to provide output clock signaling at 302, the output clock signaling may be provided to a PLL at 501. At 502, a counter of such PLL may be programmed. Such programming may be for frequency translation. At 503, a first frequency of the input clock signaling obtained at 301 may be translated to a second frequency different from the first frequency. At 504, operative clock signaling at the second frequency may be output. It should be understood that such operative clock signaling is responsive to the output clock signaling shaped by filtering at 302.

While the foregoing describes exemplary embodiment(s) in accordance with one or more aspects of the invention, other and further embodiment(s) in accordance with the one or more aspects of the invention may be devised without departing from the scope thereof, which is determined by the claim(s) that follow and equivalents thereof. For example, even though a filter can be passive or active, a PLL can have frequency multiplication. Claim(s) listing steps do not imply any order of the steps. Trademarks are the property of their respective owners.

What is claimed is:

1. A clock circuit, comprising:
    a filter coupled to receive a first input clock signal, wherein the first input clock signal is noncompliant with a phase parameter of a serial link specification for a serial link owing to phase noise;
    the filter coupled to provide an output clock signal, wherein the phase noise of the first input clock signal is shaped by the filter to reform the first input signal in order to provide the output clock signal for compliance with the phase parameter of the serial link specification for the serial link for at least a gigabit per second speed;
    the filter for filtering noise of the first input clock signal to shape the phase noise to provide the output clock signal; and
    a lock loop circuit directly connected to the filter to receive the output clock signal.

2. The clock circuit according to claim 1, wherein the lock loop circuit is a phase lock loop.

3. The clock circuit according to claim 1, wherein the lock loop circuit is a delay lock loop.

4. The clock circuit according to claim 1, wherein the filter is a low-pass filter.

5. The clock circuit according to claim 1, wherein the filter is a band-pass filter.

6. The clock circuit according to claim 1, wherein the filter is a high-pass filter.

7. The clock circuit according to claim 1, wherein the filter is an equalization filter.

8. The clock circuit according to claim 1, wherein the filter is a programmable filter.

9. The clock circuit according to claim 8, wherein the programmable filter has programmable poles and zeroes for noise shaping.

10. The clock circuit according to claim 1, wherein the filter is further coupled to receive a second input clock signal.

11. The clock circuit according to claim 10, further comprising a buffer coupled to the filter to provide the first input clock signal and the second input clock signal to the filter, the first input clock signal and the second input clock signal being at least approximately 180 degrees out-of-phase with respect to one another.

12. The clock circuit according to claim 11, wherein the buffer is coupled to receive a first serial reference clock signal and a second serial reference clock signal to respectively provide the first input clock signal and the second input clock signal, the first serial reference clock signal and the second serial reference clock signal being at least approximately 180 degrees out-of-phase with respect to one another.

13. The clock circuit according to claim 12, further comprising a phase lock loop coupled to receive the output clock signal as a single signal and configured to provide a first output clock signal and a second output clock signal, the first output clock signal and the second output clock signal being at least approximately 180 degrees out-of-phase with respect to one another.

14. The clock circuit according to claim 13, wherein:
    the first output clock signal and the second output clock signal each at least meet the phase parameter of the serial link specification for the serial link;
    the phase lock loop includes a programmable counter for frequency translation; and
    the filter, the buffer, and the phase lock loop are all formed on a same integrated circuit chip.

15. A method for adjustment of phase noise, comprising:
    obtaining input clock signaling having the phase noise;
    filtering the input clock signal to adjust the phase noise to provide output clock signaling;
    wherein the filtering includes:
        programming the filter to shape the phase noise to reform the input clock signaling; and
        shaping the phase noise responsive to the programming to at least meet a specification for the phase noise for a serial link for at least a gigabit per second speed;
    providing the output clock signal directly to a phase lock loop;
    programming a counter of the phase lock loop;
    translating a first frequency of the input clock signaling to a second frequency different from the first frequency; and
    outputting operative clock signaling at the second frequency.

* * * * *